US011569438B2

(12) United States Patent
Reznicek et al.

(10) Patent No.: US 11,569,438 B2
(45) Date of Patent: Jan. 31, 2023

(54) MAGNETORESISTIVE RANDOM-ACCESS MEMORY DEVICE

(71) Applicant: International Business Machines Corporation, Armonk, NY (US)

(72) Inventors: Alexander Reznicek, Troy, NY (US); Matthias Georg Gottwald, New Rochelle, NY (US); Pouya Hashemi, Purchase, NY (US); Bruce B. Doris, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 296 days.

(21) Appl. No.: 16/826,796

(22) Filed: Mar. 23, 2020

(65) Prior Publication Data

US 2021/0296574 A1    Sep. 23, 2021

(51) Int. Cl.
  *H01L 43/08*    (2006.01)
  *H01L 43/02*    (2006.01)
  *H01L 27/22*    (2006.01)
  *H01L 43/12*    (2006.01)
  *H01L 43/10*    (2006.01)

(52) U.S. Cl.
  CPC ............ *H01L 43/08* (2013.01); *H01L 27/222* (2013.01); *H01L 43/02* (2013.01); *H01L 43/10* (2013.01); *H01L 43/12* (2013.01)

(58) Field of Classification Search
  CPC ....... H01L 43/08; H01L 27/222; H01L 43/02; H01L 43/10; H01L 43/12
  USPC ....................................................... 257/421
  See application file for complete search history.

(56) References Cited

U.S. PATENT DOCUMENTS

| 8,557,407 | B2  | 10/2013 | Zhao |
| 8,981,505 | B2  | 3/2015  | Moriyama et al. |
| 9,502,640 | B1  | 11/2016 | Annunziata et al. |
| 9,627,608 | B2  | 4/2017  | Draeger et al. |
| 9,705,071 | B2  | 7/2017  | Annunziata et al. |
| 9,871,195 | B1  | 1/2018  | Yang et al. |
| 9,935,261 | B1  | 4/2018  | Patel et al. |
| 10,134,981 | B1 | 11/2018 | Yang et al. |
| 11,088,201 | B2* | 8/2021 | Lin ..................... H01L 27/228 |

(Continued)

OTHER PUBLICATIONS

Zhao et al., "Failure analysis in magnetic tunnel junction nanopillar with interfacial perpendicular magnetic anisotropy," Materials, vol. 9, No. 1, 2016, 41, 17 pages.

(Continued)

*Primary Examiner* — Jami Valentine Miller
(74) *Attorney, Agent, or Firm* — Jeffrey M. Ingalls

(57) ABSTRACT

A method of manufacturing a magnetic tunnel junction device is provided. The method includes forming an MTJ stack including a reference layer, a tunnel barrier layer formed on the reference layer, a free layer formed on the barrier layer, and a cap layer formed on the free layer. The method also includes performing ion beam etching (IBE) through each layer of the MTJ stack to form at least one MTJ pillar. The method also includes forming an isolation layer on sidewalls of at least the tunnel barrier layer, the isolation layer comprising a same material as that of the tunnel barrier layer. A combined width of the isolation layer and the tunnel barrier layer is equal to or greater than a width of at least one of the reference layer and the free layer.

16 Claims, 6 Drawing Sheets

(56) References Cited

U.S. PATENT DOCUMENTS

2016/0276574 A1\* 9/2016 Ohsawa .............. G11C 11/1653
2020/0006425 A1\* 1/2020 Lin ........................ H01L 43/12

OTHER PUBLICATIONS

Yoshida et al., "Reliability enhancement due to in-situ post-oxidation of sputtered MgO barrier in double MgO barrier magnetic tunnel junction," AIP Advances, vol. 7, No. 6, 2017, 065105, 6 pages.

\* cited by examiner

MAGNETORESISTIVE RANDOM-ACCESS MEMORY DEVICE

BACKGROUND

The present disclosure relates to magnetic tunnel junction (MTJ) devices and methods of manufacturing MTJ devices. Ion beam etching (IBE) can be used during the manufacture of MTJ devices to create magnetoresistive random-access memory (MRAM) device pillars. MRAM device pillars have multiple layers, and certain of these layers are composed of different materials. The different materials of the layers may experience different IBE etching rates, which may result in an encroachment of one or more layers relative to the others.

SUMMARY

Embodiments of the present disclosure relate to a method of manufacturing a magnetic tunnel junction device. The method includes forming an MTJ stack including a reference layer, a tunnel barrier layer formed on the reference layer, a free layer formed on the barrier layer, and a cap layer formed on the free layer. The method also includes performing ion beam etching (IBE) through each layer of the MTJ stack to form at least one MTJ pillar. The method also includes forming an isolation layer on sidewalls of at least the tunnel barrier layer, the isolation layer comprising a same material as that of the tunnel barrier layer. A combined width of the isolation layer and the tunnel barrier layer is equal to or greater than a width of at least one of the reference layer and the free layer.

Other embodiments relate to a magnetic tunnel junction device. The magnetic tunnel junction device includes an MTJ pillar including a reference layer, a tunnel barrier layer formed on the reference layer, a free layer formed on the tunnel barrier layer, and a cap layer formed on the free layer. The MTJ device also includes an isolation layer formed on sidewalls of at least the tunnel barrier layer, the isolation layer comprising a same material as that of the tunnel barrier layer. A combined width of the isolation layer and the tunnel barrier layer is equal to or greater than a width of at least one of the reference layer and the free layer.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
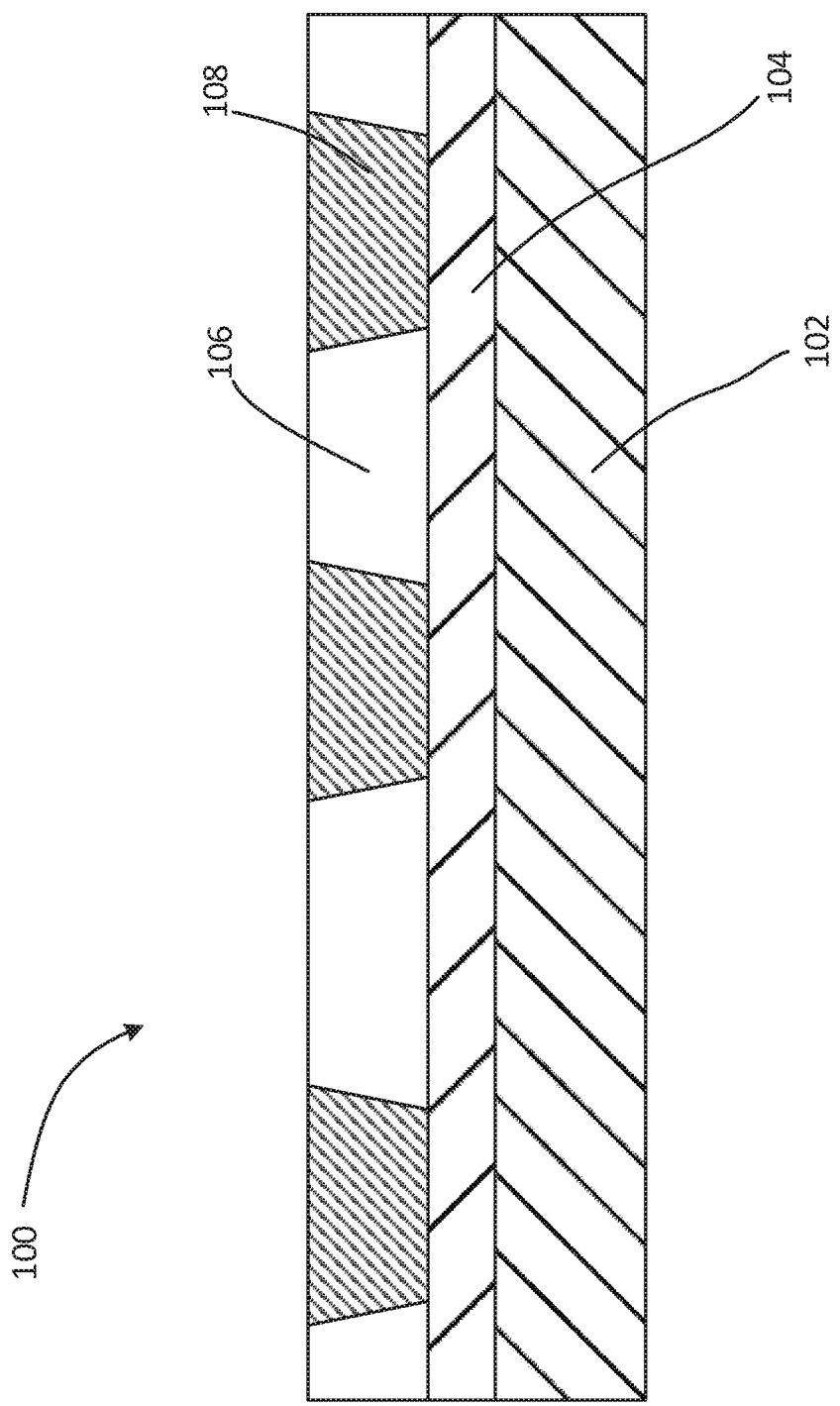
FIG. 1 is a cross-sectional view of certain base layers of an MRAM device, according to embodiments.

The present disclosure describes magnetic tunnel junction (MTJ) devices and methods of manufacturing MTJ devices. In particular, the present disclosure describes an encroachment free MJT tunnel barrier structure for magnetoresistive random-access memory (MRAM) pillars.

Certain MRAM MTJ structures are formed by blanket deposition of the MJT stack. A metal hardmask is subsequently formed, and this metal hardmask pattern dictates the size and density of the MRAM pillars. After formation of the metal hardmask, IBE is used to transfer the hardmask patterning onto the MTJ stack, thus forming the MRAM device pillars. As discussed above, different materials may have different IBE etching rates. This leads to the effect that the "softer" tunnel barrier materials (e.g., MgO) are etched faster than the remaining metal layers in the MTJ stack. This forms an encroachment (i.e., more material being etched, especially in the horizontal direction, relative to other layers) in these relatively "soft" layers. This encroachment of the tunnel barrier layer (e.g., 2-6 nm) reduces the electrical device size relative to the overall physical device size, which affects the performance of the device. Moreover, a subsequently formed pillar dielectric encapsulation layer will fill into the encroachment gaps, leading to undesirable side effects. Thus, it may be desirable to avoid the tunnel barrier material layer encroachment. Alternatively, if it is not possible to avoid the tunnel barrier layer encroachment, it may be desirable to repair this encroachment caused by the IBE pillar formation.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, embedded DRAM (eDRAM) is a dynamic random-access memory (DRAM) integrated on the same die or multi-chip module (MCM) of an application-specific integrated circuit (ASIC) or microprocessor. eDRAM has been implemented in silicon-on-insulator (SOI) technology, which refers to the use of a layered silicon-insulator-silicon substrate in place of conventional silicon substrates in semiconductor manufacturing. eDRAM technology has met with varying degrees of success, and demand for SOI technology as a server memory option has decreased in recent years. Magnetoresistive random-access memory (MRAM) devices using magnetic tunnel junctions (MTJ) are one option to replace existing eDRAM technologies. MRAM is a non-volatile memory, and this benefit is a driving factor that is accelerating the development of this memory technology.

A magnetic tunnel junction (MTJ) device, which is a primary storage element in a magnetic random access memory (MRAM), is a magnetic storage and switching device in which two ferromagnetic layers are separated by a thin insulating oxide layer (i.e., a tunnel barrier layer) to form a stacked structure. The tunnel barrier layer may comprise, for example, magnesium oxide or aluminum oxide. One of the ferromagnetic layers has a magnetization that is fixed, and it is therefore referred to as a magnetic fixed layer (or pinned layer, or reference layer). However, the other ferromagnetic layer has a magnetization that can change, and it is therefore referred to as a free layer (or magnetic free layer). When a bias is applied to the MTJ device, electrons that are spin polarized by the ferromagnetic layers traverse the insulating barrier through a process known as quantum tunneling to generate an electric current whose magnitude depends on an orientation of magnetization of the ferromagnetic layers. The MTJ device will exhibit a low resistance when a magnetic moment of the free layer is parallel to the fixed layer magnetic moment, and it will exhibit a high resistance when the magnetic moment of the free layer is oriented anti-parallel to the fixed layer magnetic moment.

The present embodiments provide structures and methods to repair the tunnel barrier damage caused by IBE while patterning the MTJ pillar. In some embodiments, the MgO that is removed by the IBE step is replaced by additional MgO material using PVD. This fills in the encroachment gap in the tunnel barrier layer as well as deposits MgO around the MTJ pillar, thus forming a thin isolation layer. In other embodiment, magnesium (Mg) is deposited by PVD immediately following the IBE pillar formation processing step. After deposition, the Mg is oxidized by bleeding oxygen into the PVD chamber. The Mg will deposit in the encroachment gap of the tunnel barrier layer as well as all around the MTJ pillar. Following this deposition of Mg, the Mg is oxidized. The orientation of the added MgO will be parallel (i.e., the <001> crystal plane) to the current flow of the original barrier layer. The reason is that the growth direction is turned approximately 90 degrees when compared to the original crystallographic orientation, which works well with cubic symmetry. The oxygen will also oxidize IBE re-sputtered material on the pillar sidewall. After the MgO layer is formed (i.e., in either of the above mentioned embodiments), the encapsulation dielectric layer is formed. Thus, the encroachment of the MgO material can be repaired by forming this thin MgO layer in the encroachment areas and on the sidewalls of the pillars between the encapsulation dielectric layer and the MTJ pillar.

If the MgO encroachment is different (i.e., non-uniform) across the wafer, the added MgO process is a "self-limiting" refill. Thus, if there are areas where there is a lesser amount of encroachment (or no encroachment), adding more MgO will not impact the performance of the MTJ device, and the overall layer of MgO around the pillar will be locally different. Because the MgO layer is an isolating layer, it does not affect the device performance. It adds only to the encapsulation layer thickness. It should be appreciated that enough MgO should be deposited to fill the most extreme encroachment (e.g., 2-8 nm) of the tunnel barrier layer.

The flowcharts and cross-sectional diagrams in the Figures illustrate methods of manufacturing MTJs according to various embodiments. In some alternative implementations, the manufacturing steps in the flowcharts may occur in a different order than that which is noted in the Figures. Moreover, any of the layers depicted in the Figures may contain multiple sublayers.

Referring now to the drawings in which like numerals represent the same or similar elements and initially to FIG. 1, an MTJ device 100 is shown at an intermediate stage of the manufacturing process, where several font-end-of-line (FEOL) layers 102 have been formed (only one FEOL layer is shown in FIG. 1 for ease of illustration). In general, FEOL refers to the first portion of IC fabrication where the individual devices (transistors, capacitors, resistors, etc.) are patterned in the semiconductor. FEOL generally refers to every layer up to (but not including) the deposition of metal interconnect layers. In this example, the FEOL layers 102 include transistors. A first metal layer 104 is formed on top of the FEOL layers 102. In this example, the first metal layer 104 includes contacts and vias (not shown). A first electrode layer 106 is formed on the first metal layer 104. The first electrode layer 106 includes a lower electrode 108 for each MTJ device 100. In the example shown in FIG. 1, three adjacent lower electrodes 108 are shown, which will correspond to the MTJ devices yet to be formed. However, it should be appreciated that hundreds or thousands or more of adjacent MTJ devices may be formed. In certain embodiments, the lower electrode 108 may include a material such as W, Cu, TaN, Ta, Ti, TiN, TiOCN, TaOCN, or a combination of these materials. In certain embodiments, after the lower electrode 108 is formed, the structure is subjected to, for example, CMP to planarize the surface for further processing. In this example, the FEOL layers 102, the first metal layer 104 and the first electrode layer 106 are a starting structure upon which the MTJ stack 150 (see, FIG. 4) is later formed. It should be appreciated that other layers may be included or omitted in this starting structure, and any layer may have multiple sublayers. It should also be appreciated that the MTJ stack 150 can be formed anywhere, including the front end, the back end, and between different metal levels.

Referring now to FIGS. 2-7, an exemplary method of manufacturing an MTJ stack to which the present embodiments may be applied is shown. In certain embodiments, the MTJ stack 150 (see, FIG. 5) includes a reference layer 202 (also referred to as a fixed layer, a pinned layer, or a magnetic fixed layer), a first tunnel barrier layer 302, a free layer 402 (also referred to as a magnetic free layer), and a cap layer 502. On one side of the MTJ stack 150 is the first electrode layer 106 and the first metal layer 104, and on an opposite side of the MTJ stack 150 is a second electrode layer 602 (see, FIG. 6) and a hard mask layer 702 (see, FIG. 7). However, it should be appreciated that the MTJ stack 150 could be described as also including the first and second electrode layers, or any other suitable number of layers. It should also be appreciated that although the present embodiments are described with respect to the example of a single MTJ stack, the features of the present embodiments (e.g., filling in an encroachment of the tunnel barrier layer) may also be applied to a double magnetic tunnel junction (DMTJ) stack structure, or any other suitable magnetic memory structures that have a tunnel barrier layer. It should also be appreciated that although MgO is described as one example material that can be used for the tunnel barrier layer, the concepts described in the present embodiments may apply to other oxide materials used in the tunnel barrier layer (e.g., $Al_2O_3$ etc.).

Figure 2:
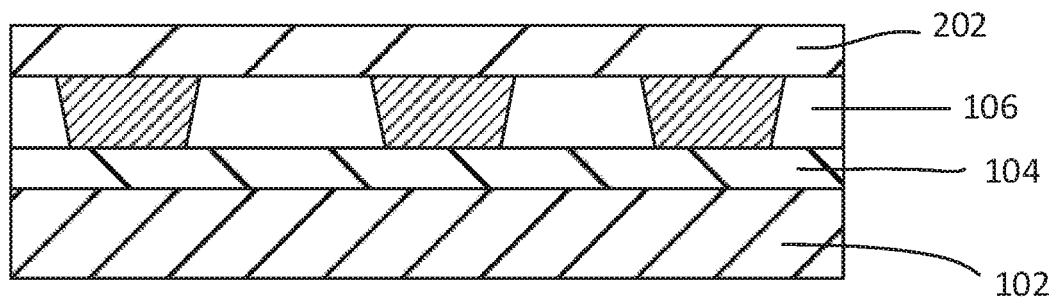
FIG. 2 depicts a cross-sectional view of the MRAM device of FIG. 1 after additional fabrication operations, according to embodiments.

Referring specifically now to FIG. 2, a reference layer 202 (i.e., a magnetic fixed layer or fixed layer) is formed on the first electrode layer 106. The first reference layer 202 may comprise a plurality of sublayers (e.g., twenty or more sublayers). In certain embodiments where the first reference layer has multiple sublayers, the outermost sublayer is comprised of CoFeB. In certain embodiments, the reference layer 202 comprises a suitable magnetic material such as, for example, cobalt, iron, boron, platinum, nickel, tungsten, iridium, or a combination thereof. In certain embodiments, the reference layer 202 is comprised of CoFeB having a thickness in the range of 10 Å-100 Å. In certain embodiments, the reference layer 202 may comprise bilayers of CoFeB and high damping materials. In certain embodiments, the reference layer 202 may comprise bilayers of CoFeB and antiferromagnetic material layers to pin the CoFeB.

Figure 3:
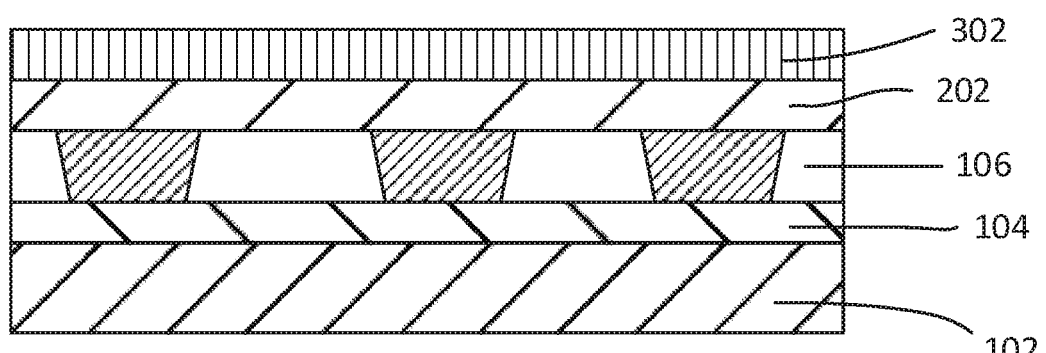
FIG. 3 depicts a cross-sectional view of the MRAM device of FIG. 2 after additional fabrication operations, according to embodiments.

Referring now to FIG. 3, a tunnel barrier layer 302 is formed on the reference layer 202. In certain embodiments, the tunnel barrier layer 302 comprises at least one of magnesium oxide (MgO), $TiO_2$, and $Al_2O_3$, or any suitable combination thereof. In certain embodiments, the tunnel barrier layer 302 may comprise one or more complex oxide materials such as MgAlO. It should be appreciated that other suitable materials may be used for the tunnel barrier layer 302 that provide good tunnel barrier properties.

Figure 4:
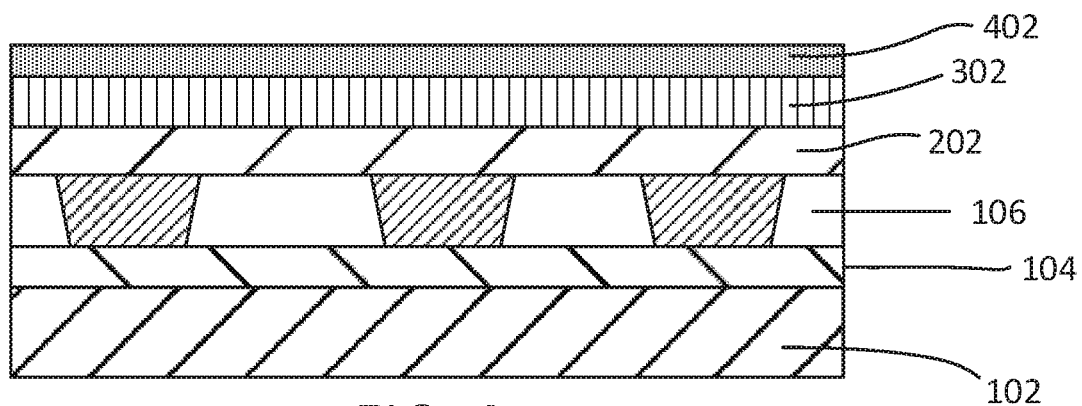
FIG. 4 depicts a cross-sectional view of the MRAM device of FIG. 3 after additional fabrication operations, according to embodiments.

Referring now to FIG. 4, a free layer 402 (i.e., magnetic free layer) is formed on the tunnel barrier layer 302. The free layer 402 is a magnetic free layer and has a magnetic moment or magnetization that can be switched. In certain embodiments, the free layer 402 may comprise a suitable magnetic material such as, for example, cobalt, iron, boron, or a combination thereof. In certain embodiments, the free layer 402 is comprised of CoFeB having a thickness in the range of 10 Å-50 Å. In certain embodiments, the free layer 402 may comprise bilayers of CoFeB for high magnetoresistance (MR), one or more layers of body centered cubic (BCC) $Co_{25}Fe_{75}$, and/or other low damping compositions for fast switchability. In certain embodiments, the free layer 402 may comprise CoX, FeX, or alloys thereof, where X is a light metal. However, it should be appreciated that the free layer 402 may be made of any suitable material or material combination known in the art.

Figure 5:
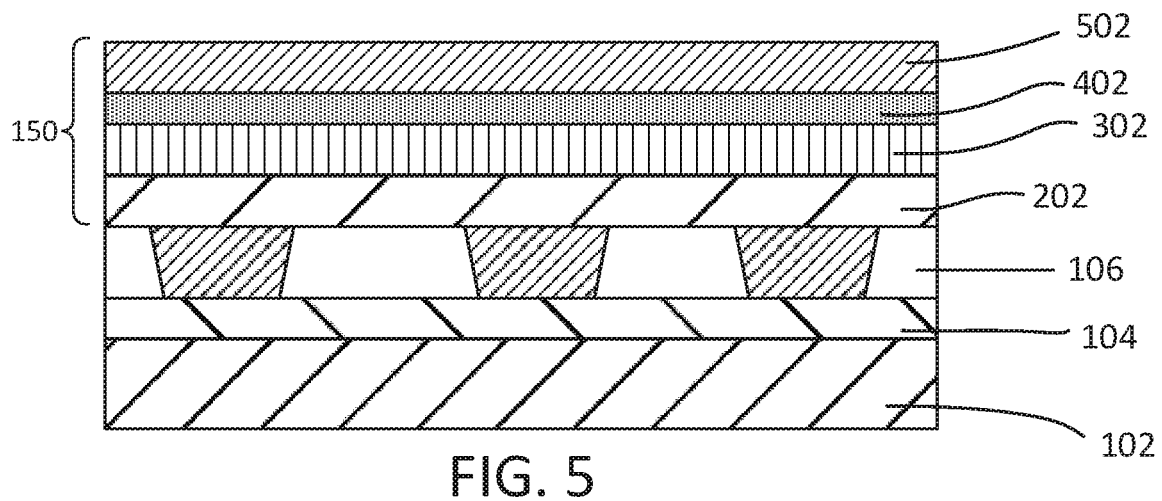
FIG. 5 depicts a cross-sectional view of the MRAM device of FIG. 4 after additional fabrication operations, according to embodiments.

Referring now to FIG. 5, a cap layer 502 is formed on the free layer 402. The cap layer 502 may be made of the same materials as the tunnel barrier layer 302, or it may be made of different materials. In certain embodiments, the cap layer 502 is composed of MgO, and this MgO forms an upper exposed surface of the MTJ stack. The cap layer 502 may be deposited by a PVD process.

Figure 6:
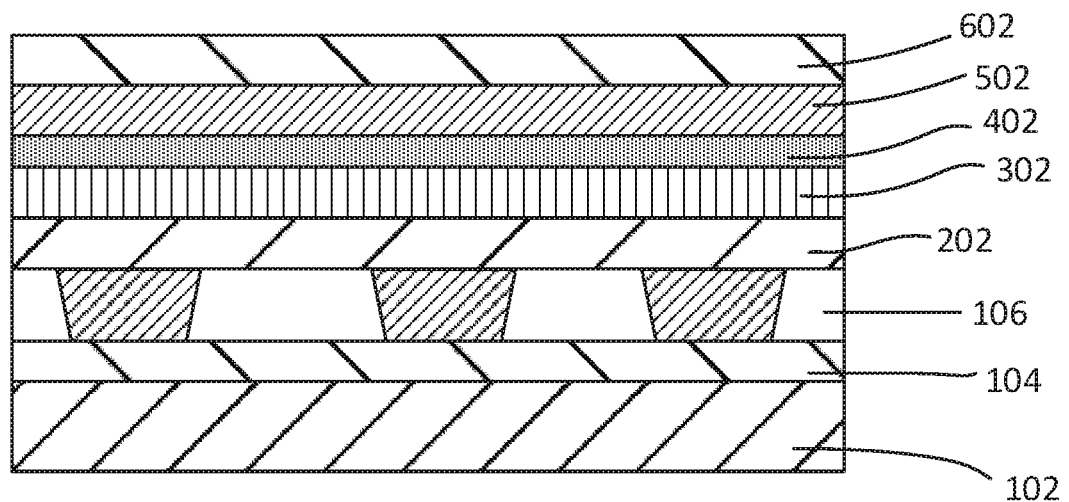
FIG. 6 depicts a cross-sectional view of the MRAM device of FIG. 5 after additional fabrication operations, according to embodiments.

Referring now to FIG. 6, an upper electrode 602 is formed on the cap layer 502. The upper electrode 602 may include a material such as W, Cu, TaN, Ta, Ti, TiN, TiOCN, TaOCN, or a combination of these materials. The upper electrode 602 may be deposited by a PVD process.

By passing a current through the MTJ stack 150 in one direction or the other from the lower electrode 108 to the upper electrode 602, a physical phenomenon will occur at the interface with the free layer 402 which may switch an orientation (i.e., direction) of magnetization of the free layer 402 depending on the direction of the current. This change in magnetization of the free layer 402 will cause the overall MTJ device 100 to exhibit a change in resistance, which may be read out to be as either a "0" state or a "1" state.

Figure 7:
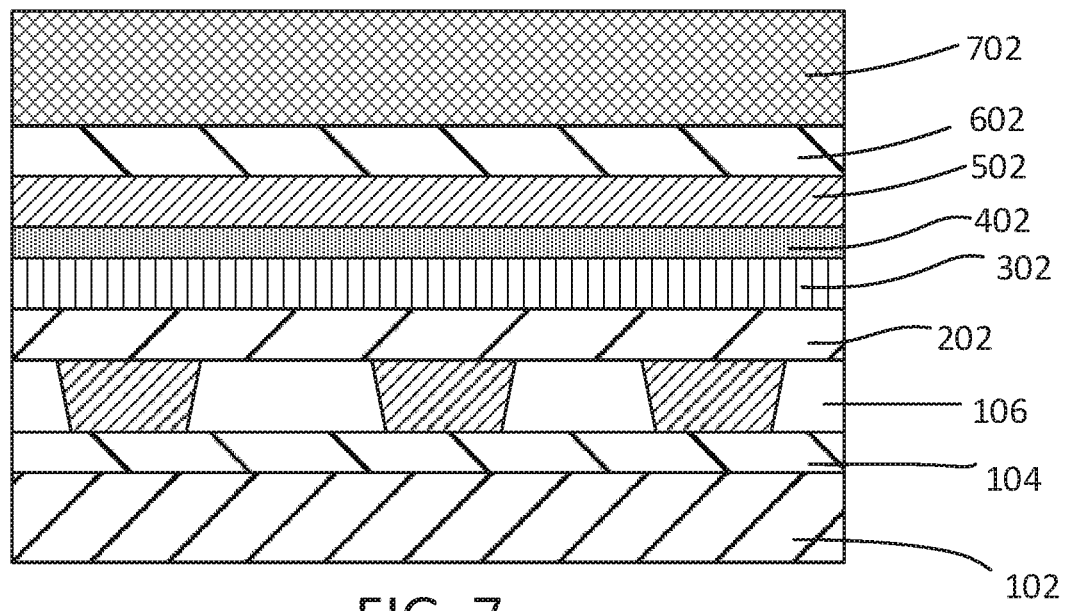
FIG. 7 depicts a cross-sectional view of the MRAM device of FIG. 6 after additional fabrication operations, according to embodiments.

Referring now to FIG. 7, a metal hardmask layer 702 is formed on the upper electrode 602. The metal hardmask layer 702 may be composed of W, TaN, TiN, a combination thereof, or any other suitable materials. The metal hardmask layer 702 may be deposited by a PVD process.

Figure 8:
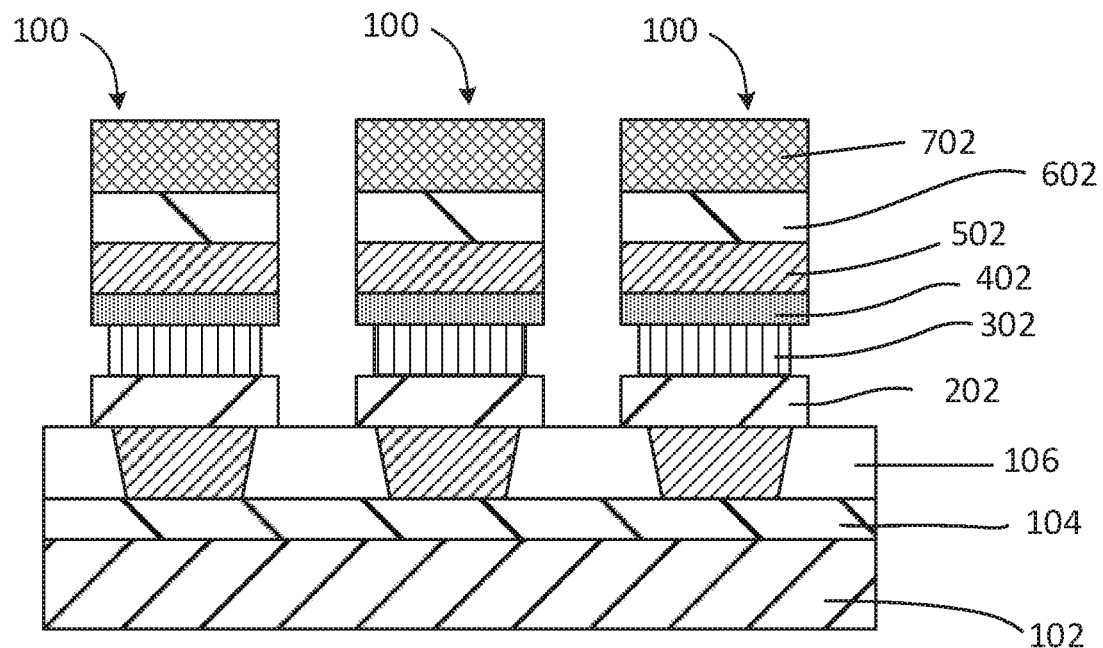
FIG. 8 depicts a cross-sectional view of the MRAM device of FIG. 7 after additional fabrication operations, according to embodiments.

Referring now to FIG. 8, in certain embodiments, the metal hardmask layer 702 is patterned by reactive ion etching (RIE), stopping on top of the blanked MTJ stack 150. RIE does not work for patterning the remaining layers because the MTJ stack consists of thin layers of multiple metals, all having different RIE etch conditions. Accordingly, ion beam etching (IBE) is used to pattern the remaining layers (i.e., upper electrode 602, cap layer 502, free layer 402, tunnel barrier layer 302 and reference layer 202) using the metal hardmask layer 702 as a mask to form, in this example, three different MTJ devices 100. However, as discussed above, different materials have different etching rates when subjected to IBE. This leads to an effect that the "softer" (i.e., relatively easier to etch) tunnel barrier layers 302 that are composed of MgO, for example, are etched more than certain of the remaining metal layers of the MTJ stack, thus forming an encroachment in the tunnel barrier layer 302. It should be appreciated that although the cap layer 502 is not shown to have an excess amount of etching in FIG. 8, it may in fact have an increased amount of etching similar to the tunnel barrier layers 302 when it is composed of MgO or similar materials.

As shown in FIG. 8, after the IBE etching process, the tunnel barrier layers 302 each have an encroachment in the horizontal direction relative to the other layers. In certain examples, the encroachment of the tunnel barrier layer 302 may be 2-6 nm in the horizontal direction. This reduction in the dimensions of the tunnel barrier layer 302 effectively reduces the electrical device size relative to the overall physical device size. Also, these encroachment spaces may possibly be filled in with an interlayer dielectric material when the MTJ device 100 pillars are later filled in with a dielectric encapsulation layer. This could possibly lead to other unwanted and uncontrollable side effects related to device performance. Thus, certain of the embodiments described herein provide methods for repairing the damage caused by the IBE encroachment of tunnel barrier layers 302 of the MTJ devices 100 during pillar formation.

Figure 9:
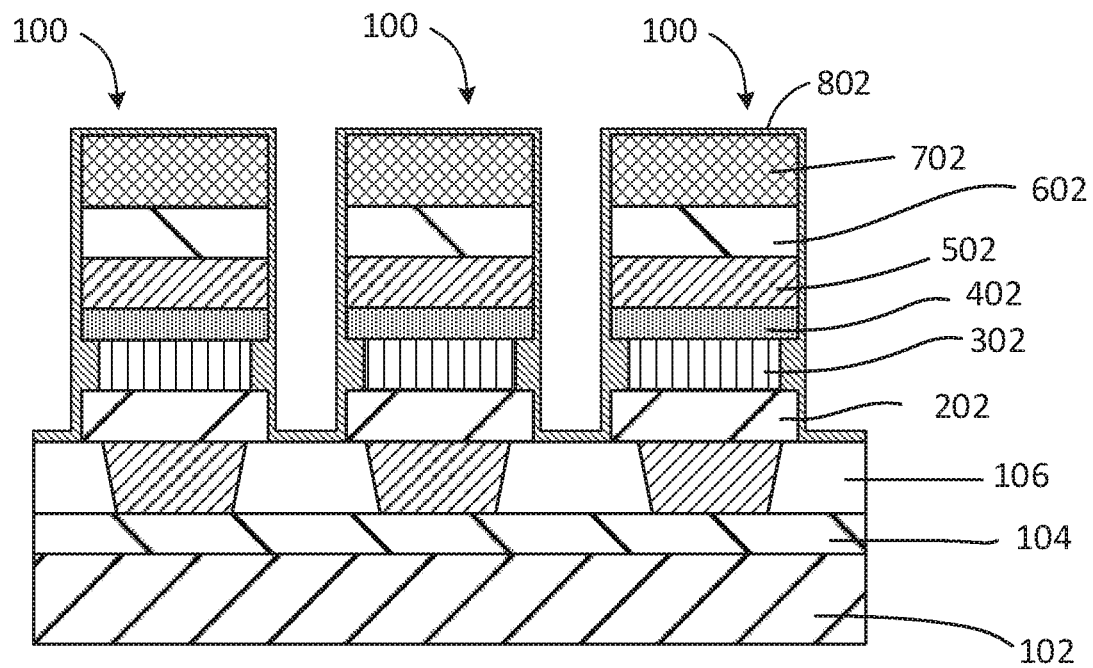
FIG. 9 depicts a cross-sectional view of the MRAM device of FIG. 8 after additional fabrication operations, according to embodiments.

Referring now to FIG. 9, in certain embodiments, the damage caused to the tunnel barrier layer 302 is repaired by forming an isolation layer 802 in the encroachment regions thereof (and all around the pillar structure of the MTJ device 100) using the same material as used for the tunnel barrier layer 302. In certain examples, the isolation layer 802 is a MgO layer (i.e., similar to the material of the tunnel barrier layer 302 and the cap layer 502) that is formed by a PVD process to cover the top surfaces of the first electrode layer 106 and the hardmask layer 702, as well as the sidewalls of the reference layer 202, the tunnel barrier layer 302 (i.e., including in the encroachment areas thereof), the free layer 402, the cap layer 502, the upper electrode layer 602 and the hardmask layer 702. However, it should be appreciated that the main purpose of the isolation layer 802 is to fill in (or repair) the encroachments of the MgO in the tunnel barrier layer 302. As such, it is generally sufficient to add just enough MgO material when forming the isolation layer 802 to fill in these encroachments, and the fact that the material is also formed on other surfaces of the MTJ stack is incidental due to the nature of the PVD deposition process (i.e., the additional material outside of the encroachment areas does not affect/improve device performance).

In other embodiments, rather than adding a MgO isolation layer 802, a layer of elemental magnesium (Mg) is deposited by PVD after the pillar formation. In these embodiments, after the Mg layer is deposited, then the Mg is oxidized by bleeding oxygen into the PVD chamber. Thus, the Mg will initially deposit into the encroachment gap of the tunnel barrier layer 302 and all around the MTJ pillar, and then it will subsequently be oxidized.

In any of the embodiments described above with respect to FIG. 9, the orientation of the added MgO will be parallel to the <001> crystallographic plane and parallel to the current flow of the original tunnel barrier layer 302. The reason for this is that the growth direction of the added MgO is oriented 90 degrees relative to the original growth direction of the tunnel barrier layer 302. This works well with the cubic symmetry of the crystal structure. Also, the oxygen (either in the form of the MgO, or the oxygen (O$_2$) used to oxidize the pure Mg) may have the effect of oxidizing any of the material that is re-sputtered on the pillar sidewalls during the IBE pillar formation procedure. In certain embodiments, if the MgO encroachment is different (or non-uniform) across the different MTJ devices 100 (e.g., across the entire surface of the wafer), the added MgO of the thin isolation layer 802 may be a self-limiting refill process. That is, even if there is locally less encroachment of the tunnel barrier layer 302, adding more MgO than is necessary to fill the encroachment is not harmful to the performance of the devices. That is, even if the thickness of the MgO isolation layer around the pillar is not of a uniform thickness, the MgO is isolating and will not affect the device performance characteristics (i.e., it simply adds to the isolation layer thickness in certain areas). In certain examples, the thickness of the isolation layer 802 ranges from about 2 nm to 8 nm. It should be appreciated that the thickness may vary from this range, but it should be of a sufficient thickness to fill the most extreme encroachment dimensions of the tunnel barrier layer 302.

Figure 10:
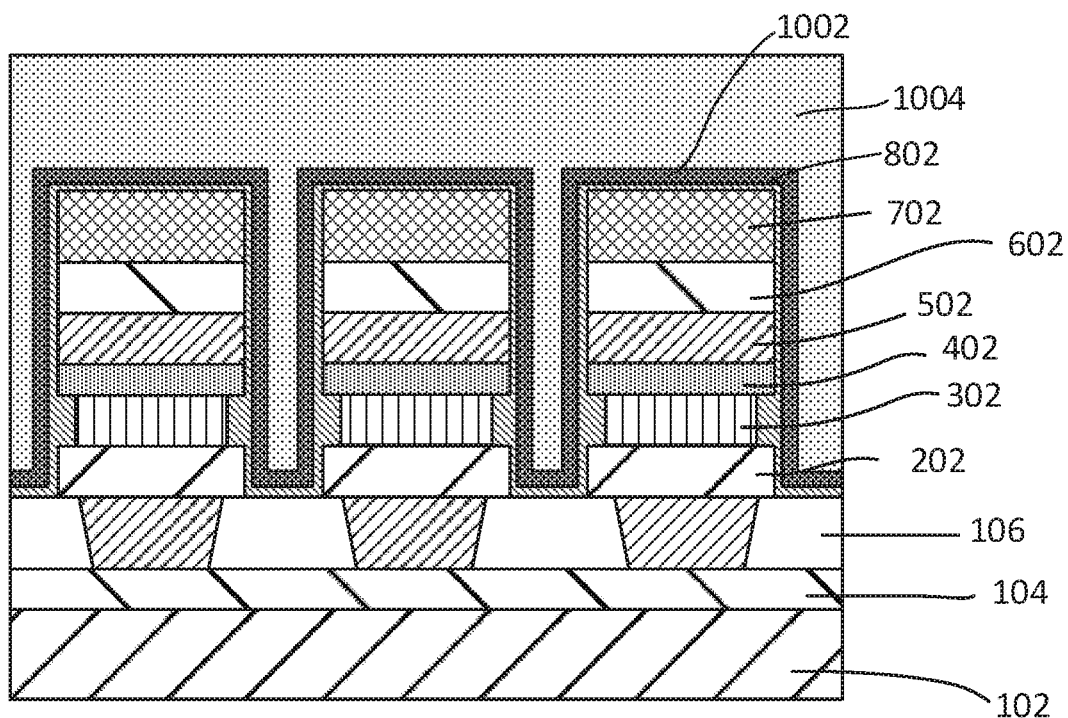
FIG. 10 depicts a cross-sectional view of the MRAM device of FIG. 9 after additional fabrication operations, according to embodiments.

Referring now to FIG. 10, a dielectric encapsulation layer 1002 is formed to cover the exposed surfaces of the isolation layer 802. For example, the dielectric encapsulation layer may comprise at least one of PVD, ALD, PECVD, AlOx, TiOx, BN, SiN and SiBCN. In certain embodiments, following the formation of the dielectric encapsulation layer 1002, the device can be subjected to an optional pre-treatment utilizing, for example, plasma O$_2$, H$_2$, N$_2$, NH$_3$ or a combination thereof. Then, an interlayer dielectric layer 1004 is deposited and formed to fill in the spaces between adjacent MTJ devices 100. The interlayer dielectric layer 1004 may comprise, for example, a flowable low-K CVD dielectric material.

Figure 11:
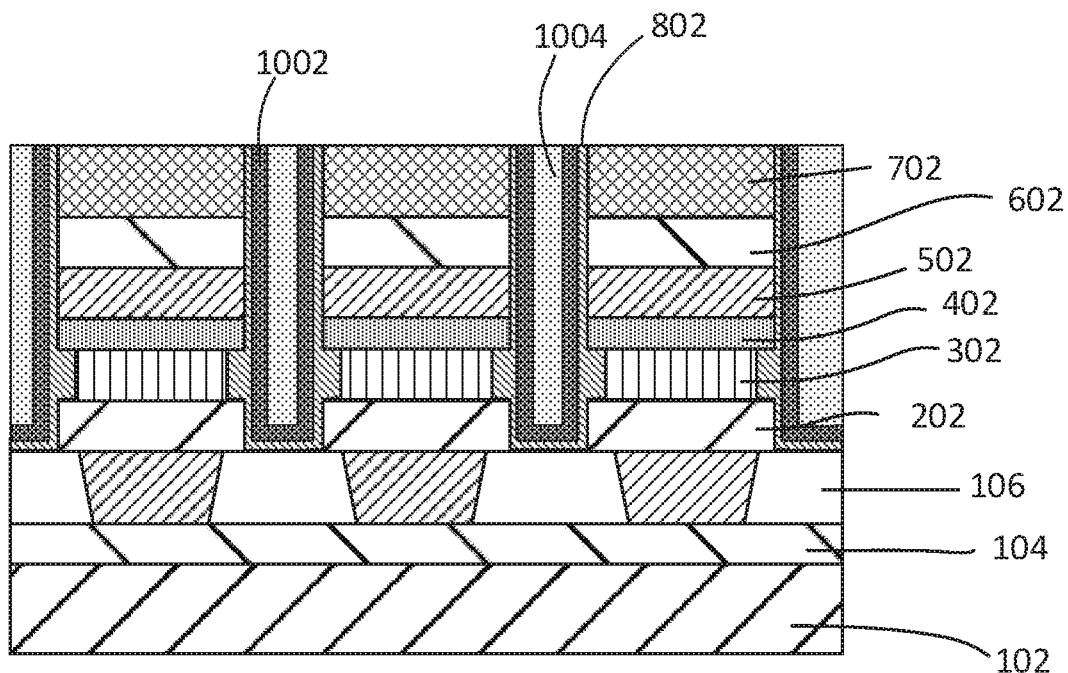
FIG. 11 depicts a cross-sectional view of the MRAM device of FIG. 10 after additional fabrication operations, according to embodiments.

Referring now to FIG. 11, a CMP planarization process is performed on the MTJ devices 100 down to the level of the hardmask layer 702. This CMP process exposes upper surfaces of the hardmask layer 702.

Figure 12:
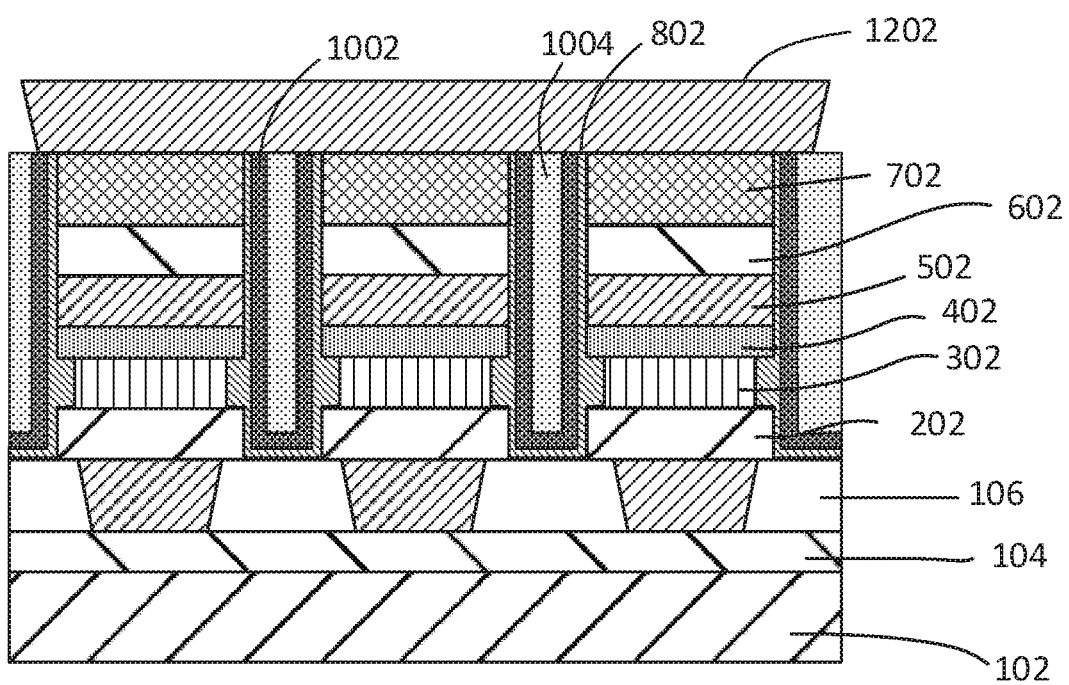
FIG. 12 depicts a cross-sectional view of the MRAM device of FIG. 11 after additional fabrication operations, according to embodiments.

Referring now FIG. 12, a next level metal line 1202 if formed to contact the upper portions of the MRAM pillars. In certain embodiments, the next level metal line 1202 is composed of Ta, TaN, Cu, or any suitable combination thereof.

In certain embodiments, the MgO material of the isolation layer 802 will also cover the sidewalls of the free layer 402. This may create an interface anisotropy between the material of the free layer 402 (e.g., CoFeB) and the added MgO. This could modify the perpendicular magnetic anisotropy (PMA) at the edges of the free layer 402, which may help with the magnetization of the free layer 402.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a magnetic tunnel junction (MTJ) device, the method comprising:
    forming an MTJ stack including
        a reference layer,
        a tunnel barrier layer formed on the reference layer,
        a free layer formed on the barrier layer, and
        a cap layer formed on the free layer;
    performing ion beam etching (IBE) through each layer of the MTJ stack to form at least one MTJ pillar; and
    forming an isolation layer on sidewalls of at least the tunnel barrier layer, the isolation layer comprising a same material as that of the tunnel barrier layer,
    wherein a combined width of the isolation layer and the tunnel barrier layer is equal to or greater than a width of at least one of the reference layer and the free layer,
    wherein a width of the tunnel barrier layer is less than a width of the reference layer and a width of the free layer.

2. The method according to claim 1, wherein the isolation layer is conformally formed to cover entire sidewall surfaces of the MTJ pillar.

3. The method according to claim 1, wherein the material of the tunnel barrier layer is MgO, and the material of the isolation layer is MgO.

4. The method according to claim 1, wherein a crystal orientation of the isolation layer is different from a crystal orientation of the tunnel barrier layer.

5. The method according to claim 1, further comprising forming a dielectric encapsulation layer on the isolation layer.

6. The method according to claim 5, further comprising forming an interlayer dielectric layer on the dielectric encapsulation layer and between adjacent MTJ pillars.

7. The method according to claim 1, wherein forming the MTJ stack further comprises
    forming an electrode on the cap layer, wherein the cap layer comprises MgO.

8. The method according to claim 1, wherein a width of the isolation layer ranges from about 2 nm to about 8 nm.

9. A magnetic tunnel junction device (MTJ) comprising:
    an MTJ pillar including
        a reference layer,
        a tunnel barrier layer formed on the reference layer,
        a free layer formed on the tunnel barrier layer, and
        a cap layer formed on the free layer; and
    an isolation layer formed on sidewalls of at least the tunnel barrier layer, the isolation layer comprising a same material as that of the tunnel barrier layer,
    wherein a combined width of the isolation layer and the tunnel barrier layer is equal to or greater than a width of at least one of the reference layer and the free layer, and
    wherein a width of the tunnel barrier layer is less than a width of the reference layer and a width of the free layer.

10. The magnetic tunnel junction device according to claim 9, wherein the isolation layer is conformally formed to cover entire sidewall surfaces of the MTJ pillar.

11. The magnetic tunnel junction device according to claim 9, wherein the material of the tunnel barrier layer is MgO, and the material of the isolation layer is MgO.

12. The magnetic tunnel junction device according to claim 9, wherein a crystal orientation of the isolation layer is different from a crystal orientation of the tunnel barrier layer.

13. The magnetic tunnel junction device according to claim 9, further comprising a dielectric encapsulation layer formed on the isolation layer.

14. The magnetic tunnel junction device according to claim 13, further comprising an interlayer dielectric layer formed on the dielectric encapsulation layer and between adjacent MTJ pillars.

15. The magnetic tunnel junction device according to claim 9, further comprising
an electrode formed on the cap layer, wherein the cap layer comprises MgO.

16. The magnetic tunnel junction device according to claim 9, wherein a thickness of the isolation layer ranges from about 2 nm to about 8 nm.

* * * * *